(12) United States Patent
Hagemeister et al.

(10) Patent No.: US 6,737,981 B2
(45) Date of Patent: May 18, 2004

(54) APPARATUS FOR CONVERTING MEASUREMENT SIGNALS INTO DIGITAL SIGNALS, THE SIGNALS HAVING BEEN INITIATED IN A PIEZO SENSOR BY THE IMPACTS OF A HYDRAULIC PERCUSSION DEVICE

(75) Inventors: Wilhelm Hagemeister, Issum (DE); Thomas Deimel, Mülheim (DE); Heinz-Jürgen Prokop, Ratingen (DE)

(73) Assignee: Krupp Berco Bautechnik GmbH, Essen (DE)

( * ) Notice: Subject to any disclaimer, the term of this patent is extended or adjusted under 35 U.S.C. 154(b) by 0 days.

(21) Appl. No.: 10/151,864

(22) Filed: May 22, 2002

(65) Prior Publication Data

US 2003/0004603 A1 Jan. 2, 2003

(30) Foreign Application Priority Data

Jun. 28, 2001 (DE) .......................................... 101 31 284

(51) Int. Cl.[7] .............................................. G08B 21/00

(52) U.S. Cl. ........................ 340/679; 340/680; 340/665

(58) Field of Search ................................ 340/679, 680, 340/665; 324/76.11; 73/649

(56) References Cited

U.S. PATENT DOCUMENTS

2002/0001527 A1 * 1/2002 Beller et al. ................ 417/300

* cited by examiner

Primary Examiner—Julie Lieu
(74) Attorney, Agent, or Firm—Venable LLP; Ralph P. Albrecht

(57) ABSTRACT

An apparatus for converting measurement signals into digital signals suitable for processing in a microprocessor (12), with the signals having been initiated in a piezo sensor (6) by accelerations acting on the sensor during the impacts of a percussion device (1), particularly a hydraulic hammer, and being used to determine the number of work strokes that have been executed in the impact direction (arrow 3) of the percussion device (1). The conversion apparatus includes: a rectifier (8) that is connected to the output (6*a*) of the piezo sensor (6) and suppresses the negative component of the measurement signal; a peak-value detector (9) that is connected to the rectifier (8) and converts the remaining, positive component of the measurement signal into an envelope curve; a high-pass filter (10) that causes the envelope curves of consecutive measurement signals to be converted into intermediate signals whose amplitude respectively has a zero passage; and a comparator (11) that is disposed downstream of the high-pass filter (10) and whose output is connected to the digital input (12*a*) of the microprocessor (12), thereby effecting the conversion of the intermediate signals into digital signals having a rectangular amplitude response.

6 Claims, 3 Drawing Sheets

APPARATUS FOR CONVERTING MEASUREMENT SIGNALS INTO DIGITAL SIGNALS, THE SIGNALS HAVING BEEN INITIATED IN A PIEZO SENSOR BY THE IMPACTS OF A HYDRAULIC PERCUSSION DEVICE

CROSS REFERENCE TO RELATED APPLICATION

This application claims the priority of German Patent Application No. 101 31 284.9 filed Jun. 28, 2001, which is incorporated herein by reference.

BACKGROUND OF THE INVENTION

The invention relates to an apparatus for converting measurement signals into digital signals that are suitable for processing in a microprocessor. More particularly the present invention relates to such an apparatus wherein the signals have been initiated in a piezo sensor by accelerations acting on the sensor during the impacts of a percussion device, particularly a hydraulic hammer, and are used to determine the number of work strokes that have been executed in the impact direction of the percussion device.

Similarly to the solution known from the document DE 199 23 680 A1, the invention is based on the realization that the current total number of impacts executed by the percussion aggregate represents a relevant variable for determining the active service life, and—through a comparison to comparable preset values—can also yield information regarding the state of utilization of the relevant percussion aggregate.

The simplest method of obtaining information about the state of utilization of the percussion device is to check whether the current total number of impacts executed by the percussion device has attained an order of magnitude that corresponds to the total number of impacts that defines a maintenance-free operating period.

The above cited document, which was published prior to this application, proposes to determine the service life and the state of utilization of a hydraulic percussion device by generating measurement signals during the individual, consecutive operating periods of the percussion device, from which the number of strokes that the percussion piston of the percussion device has executed in a direction of movement can be determined. The publication further proposes to continuously add the number of signals and store the total number, and make the current total number of signals recognizable, at least temporarily, in the form of an indicator of the state of utilization.

To generate the measurement signals that indicate the number of impacts, a measurement-value indicator can be provided in the form of a piezo sensor, which detects oscillations that have been initiated by the percussion-piston strokes.

SUMMARY OF THE INVENTION

It is the object of the invention to provide an apparatus for converting relevant measurement signals that have been generated by a piezo sensor into digital signals, with the apparatus reliably supplying the necessary information and having a low energy requirement, despite the difficult working conditions expected in the use of hydraulic percussion devices.

Furthermore, the novel conversion apparatus is intended to be embodied to permit a compact design, and thus easily be mounted, without any special measures, to the percussion device at a location that is suitable for generating measurement signals.

Finally, the conversion apparatus is intended to be distinguished by the fact that it is extensively independent of the design, structural size and other characteristic features of the percussion device to be monitored.

The above object generally is accomplished by a novel conversion apparatus wherein the underlying concept lies in re-forming measurement signals, which have been generated in consecutive stages by a piezo sensor, into digital signals that provide sufficiently reliable information about the impacts executed by the percussion device, and are in a suitable form for processing in a microprocessor.

The conversion apparatus according to the invention includes: a rectifier that is connected to the output of the piezo sensor and suppresses the negative component of the measurement signal produced by the piezo sensor; a peak-value detector, that is connected to the output of the rectifier and converts the remaining, positive component of the measurement signal into an envelope curve; a high-pass filter that causes the envelope curves of consecutive measurement signals to be converted into intermediate signals whose amplitude has a regenerative zero passage; and a comparator, which is disposed downstream of the high-pass filter and is connected on the output side to the digital input of the microprocessor, that effects the conversion of the intermediate signals into digital signals having a rectangular amplitude response.

The high-pass filter changes the signals that are introduced into it such that their amplitude has a perfect zero passage. Accordingly, the conversion apparatus is automatically adapted to the associated percussion device. Consequently, the conversion apparatus can be used in connection with differently-configured percussion devices without necessitating an equipment conversion.

Within the scope of the invention, a piezoelectric shock sensor, such as is found in a laptop for protecting the hard disk, can be used as a piezo sensor.

According to a feature of the invention, the comparator additionally has a capacitor that is designed such that only digital signals located at a predetermined minimum interval from the digital signal of the preceding impact are present at the comparator output. The additional capacitor therefore assures the suppression of "error signals" also generated by the piezo sensor, which may be initiated, for example, by accelerations of the percussion aggregate that are not typically anticipated.

The invention is preferably embodied such that the piezo sensor simultaneously forms the energy source for the components disposed upstream of the comparator—namely, the rectifier, the peak-value detector and the high-pass filter—and the comparator is connected to an energy supply that is independent of the piezo sensor. The advantage of this feature is that the conversion apparatus, with the exception of the comparator, requires no external energy supply, and only exhibits a low energy consumption.

Accordingly, it is possible to equip the conversion apparatus and the downstream microprocessor with an integrated battery unit that may permit a service life of more than five years. The battery unit can particularly comprise one or more lithium-thionyl-chloride batteries.

In a measure for improving the handling and the economical aspect of the conversion apparatus, the piezo sensor, the rectifier, the peak-value detector, the high-pass filter and the comparator can be combined with the microprocessor to form a combined mechanical component, which is secured as a unit to the housing of the percussion device.

The listed components, as well as the aforementioned battery unit and the capacitor that may additionally be associated with the comparator, are preferably secured inside a metallic sleeve by an elastic filling compound, while the sleeve is secured to the housing of the percussion device by an elastic damping layer. The oscillating behavior of the filling compound and the damping layer stipulates that they be designed such that the accelerations originating from the percussion device initiate the necessary signals in the piezo sensor with sufficient reliability.

In a normal scenario, it suffices for the piezo sensor, the rectifier, the peak-value detector, the high-pass filter and the comparator to be designed, and matched to one another, such that the components are capable of functioning at percussion-device impact frequencies between 3 and 70 Hz. This embodiment renders the conversion apparatus extensively independent of the design, structural size and other characteristic features of the percussion device, without significant adaptive measures.

The invention is described in detail below in conjunction with the drawing.

DESCRIPTION OF THE PREFERRED EMBODIMENTS

Figure 1:
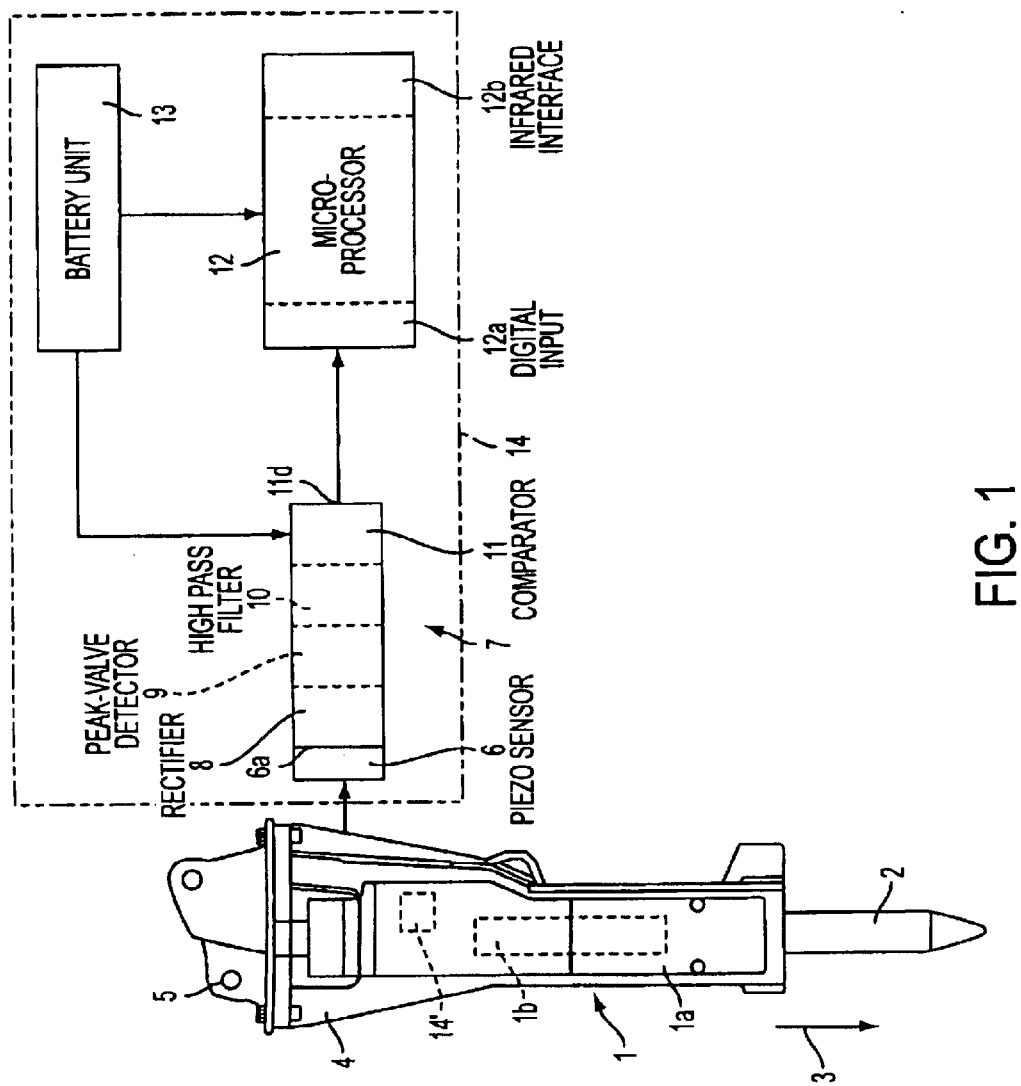
FIG. 1 is a schematic view of the basic structure of the novel conversion apparatus, as well as the microprocessor and battery unit, cooperating with a hydraulic hammer.

The representation according to FIG. 1 depicts a hydraulic percussion device, which is known per se, in the form of a hydraulic hammer 1. In the housing 1a of the hammer, a percussion piston 1b is guided to move back and forth in the longitudinal direction, and, due to the effect of a control unit, not shown, acts on a tool as a chisel 2, with the movement energy originating from the percussion piston 1b being converted into impact energy. An arrow 3 indicates the movement of the percussion piston 1b in the direction of the work stroke (impact direction).

The housing 1a is secured to a support element 4 that is formed as a support housing or support frame and has a connector console 5. The console allows the support element 4 to be connected to a support device, particularly the boom of a hydraulic excavator. As ensues from the publication DE 199 23 680, the support device also supplies the hydraulic energy needed for operating the hydraulic hammer 1.

The accelerations occurring in the operating state of the hydraulic hammer 1, that is, during the impacts of the percussion piston 1b, also act on a piezo sensor 6, thereby initiating measurement signals in the sensor that can be used to determine the number of work strokes executed in the impact direction (arrow 3) of the hydraulic hammer 1. The output 6a of the piezo sensor 6 is electrically connected to the conversion apparatus 7, whose primary components include a rectifier 8, a peak-value detector 9, a high-pass filter 10 and a comparator 11.

On the output side, the comparator 11 is connected to the digital input 12a of a microprocessor 12, in which the digital signals generated by the effect of the comparator 11 are stored and processed. The microprocessor 12 particularly serves in storing and adding the received digital signals, and using them to derive and supply data relating to the active service life of the hydraulic hammer 1, as well as data relating to the state of utilization of the hydraulic hammer 1 as they relate to predetermined maintenance intervals.

The information supplied by the microprocessor 12 can be read out in a wireless manner by way of an infrared interface 12b, for example, via a laptop or a mobile telephone. The infrared interface 12b also facilitates the transfer of data, programs and commands to the microprocessor 12.

A battery unit 13 having at least one lithium-thionyl-chloride battery is provided for supplying energy to the microprocessor 12 and the comparator 11. To extend the service life of the battery 13, the conversion apparatus 7 is configured such that the piezo sensor 6 simultaneously constitutes the energy source for the rectifier 8, the peak-value detector 9 and the high-pass filter 10. These components of the conversion apparatus 7 are therefore not connected to an external energy supply.

As indicated in FIG. 1 by a dot-dash rectangular surface 14, the components 6 through 13 are combined to form a mechanical component that is secured as a unit to the housing 1a of the hydraulic hammer 1. The component defined by the rectangular outline 14 is represented by 14' on the housing 1a. In a variation within the spirit of the invention, the aforementioned component can also be mounted on the support element 4, the connector console 5 or the support device, for example, the boom of the hydraulic excavator.

Figure 2:
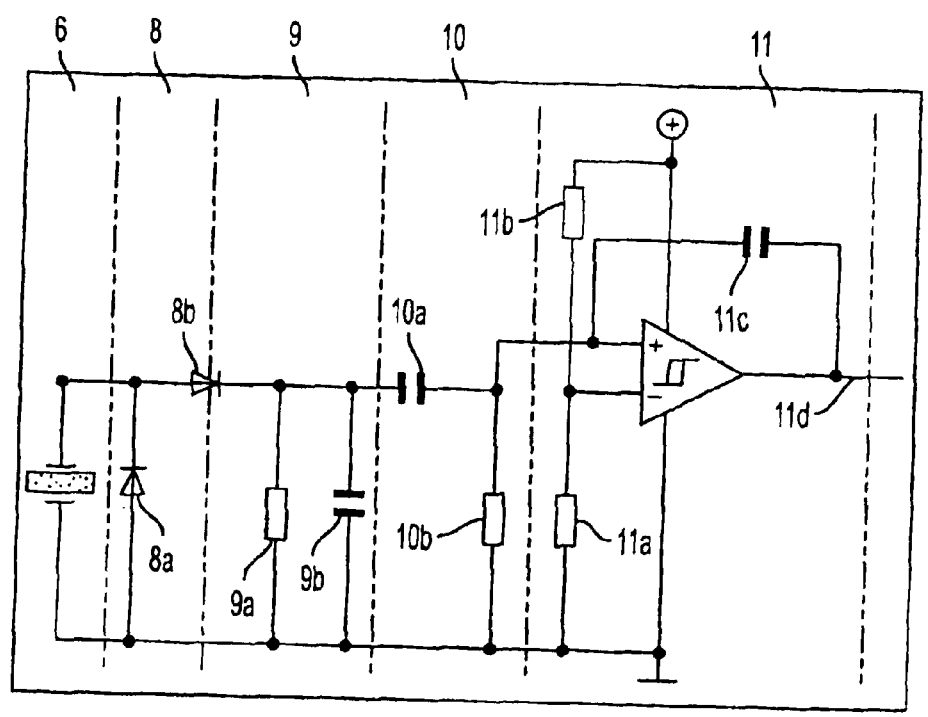
FIG. 2 is a schematic circuit diagram of the conversion apparatus shown in FIG. 1.

The schematic circuit diagram of FIG. 2 indicates the electrical connection of the components 6 and 8 through 11, as well as the fundamental layout of the components 8 through 11.

Accordingly, the output of the piezo sensor 6 is connected to the rectifier 8 having two diodes 8a and 8b, with the diode 8a being connected in parallel with the sensor and the diode 8b being connected in series with the sensor 6. The diode 8b also represents a component of the peak-value detector 9. The piezo sensor 6 is linked in turn to the peak-value detector 9, which has a high-impedance resistor 9a connected in parallel with the sensor 6 and a capacitor 9b, which is connected in parallel with the resistor 9a. Adjoining the component 9 is the high-pass filter 10 having a series capacitor 10a and a parallel connected high-impedance resistor 10b.

Disposed downstream of the high-pass filter 10 is the comparator 11, which includes a difference amplifier 11e and two high-impedance input resistors 11a and 11b, and is supplied with energy by the battery unit 13 (FIG. 1). The resistors 11a and 11b form a voltage divider that is connected across the energy supply 13 and generates a reference voltage, at its center tap that is connected to the negative input of the difference amplifier 11e. As a result, the conversion apparatus is insensitive to external interfering voltages. The output of the high-pass filter 10 is connected to the positive input of the amplifier 11e, which compares the signals at its two inputs.

The comparator 11 is additionally provided with a capacitor 11c connected between its output 11d and the positive input of the amplifier 11e. The capacitor 11c serves to suppress signals that fail to follow at a minimum interval from the signal of the preceding impact. As already mentioned, the output 11d of the comparator 11 is linked to the digital input 12a of the microprocessor 12 (FIG. 1).

The piezo sensor 6, the rectifier 8, the peak-value detector 9, the high-pass filter 10 and the comparator 11 are otherwise designed and matched to one another such that the conversion apparatus 7 formed by the components 8 through 11 can be used for impact frequencies between 3 and 70 Hz of the hydraulic hammer 1.

FIGS. 3a through 3e explain the function of the piezo sensor 6 and the components 8 through 11 of the conversion apparatus 7. Here, the amplitude response of the respective signals is shown over time (in milliseconds).

Figure 3A:
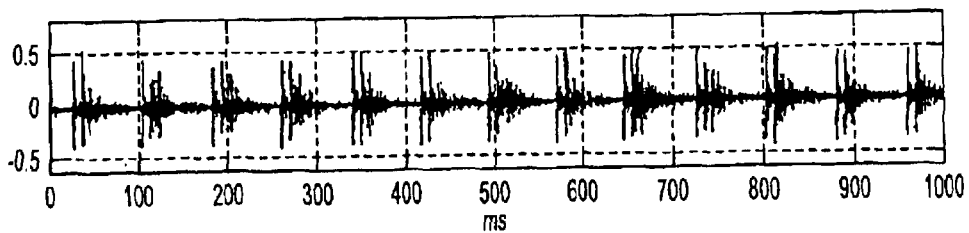
FIGS. 3a–e illustrate the multi-stage conversion of the measurement signal into a digital signal having a rectangular amplitude response.
Figure 3B:
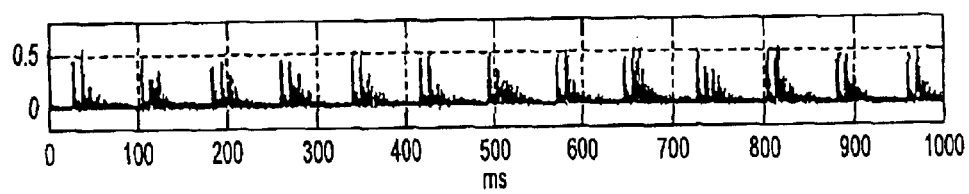
Figure 3C:
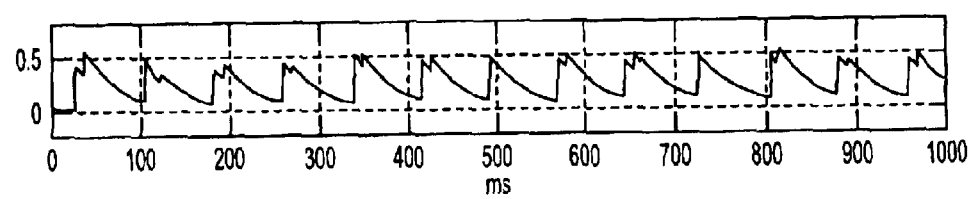
Figure 3D:
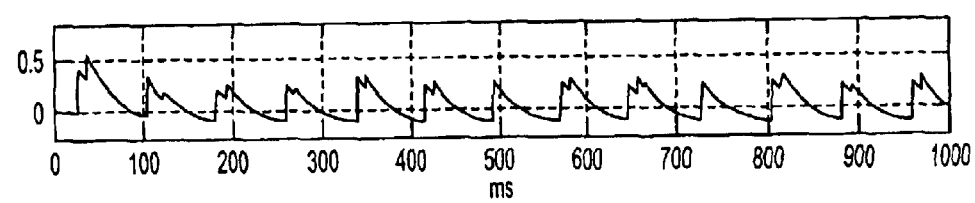
Figure 3E:
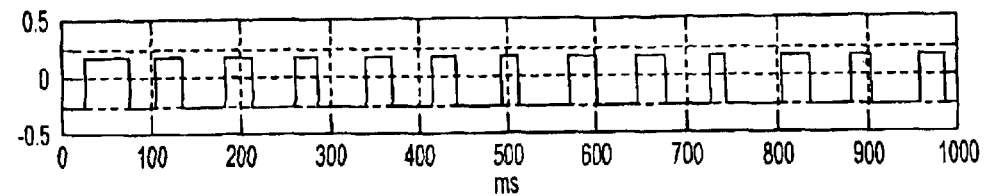

In the piezo sensor 6, the accelerations occurring due to the impacts of the hydraulic hammer 1 and acting on the piezo sensor initiate the generation of the measurement signals shown in FIG. 3a. According to FIG. 3b, the result of the influence of the rectifier 8 on these signals is the suppression, i.e., clipping, of the negative component of the measurement signal supplied to the rectifier 8. The peak-value detector 9 causes the remaining, positive component of the measurement signal to be converted into an envelope curve as shown in FIG. 3c. The effect of the high-pass filter 10 displaces this envelope curve, as can be seen in FIG. 3d, such that the amplitude response exhibits consecutive intermediate signals having "clean" zero passages.

The comparator 11 compares the signal at the output of the high-pass filter 10 with the reference voltage produced by the voltage divider 11a, 11b and converts the intermediate signals prepared in the above described manner into digital signals having a rectangular amplitude response, so that the downstream connective microprocessor 12 can receive and process them.

The above-described embodiment and the wiring of the components 6 and 8 through 11 permit the conversion apparatus 7 to be used in hydraulic percussion devices of varying designs without requiring an equipment conversion. Moreover, with a suitable layout and design of the components 6 and 8 through 10, the conversion apparatus 7, with the exception of the comparator 11, requires no additional energy source.

The invention therefore improves upon the preparation of information described in DE 199 23 680, with respect to simplification or increased economical qualities, with the information being used to derive an assessment of the active service life of a hydraulic percussion aggregate and its state of utilization, for example, with respect to anticipated maintenance intervals.

The invention now being fully described, it will be apparent to one of ordinary skill in the art that many changes and modifications can be made thereto without departing from the spirit or scope of the invention as set forth herein.

What is claimed is:

1. An apparatus for converting measurement signals into digital signals, with the measurement signals having been initiated in a piezo sensor by accelerations acting on the sensor during the impacts of a percussion device and being used to determine the number of work strokes that have been executed in the impact direction of the percussion device with the digital signals being suitable for processing in a microprocessor, said apparatus comprising:

a rectifier that is connected to the output of the piezo sensor and suppresses the negative component of a measurement signal produced by the piezo sensor;

a peak-value detector connected to the output of the rectifier and converting a remaining, positive component of the measurement signal into an envelope curve;

a high-pass filter connected to receive the envelope curve produced by the peak value detector and causing the envelope curves of consecutive measurement signals to be converted into intermediate signals whose amplitude has a respective zero passage; and a comparator, whose input is connected to the output of the high-pass filter and whose output is connected to a digital input of the microprocessor, for comparing the intermediate signals provided by the filter with a reference signal to effect the conversion of the intermediate signals into digital signals having a rectangular amplitude response.

2. The apparatus according to claim 1, wherein the comparator is provided with a capacitor connected between its input and output, and which causes only digital signals located at a predetermined minimum interval from the digital signal of the preceding impact to be present at the comparator output.

3. The apparatus according to claim 1, wherein: the piezo sensor simultaneously constitutes the energy source for the rectifier, the peak-value detector, and the high-pass filter, which are all disposed upstream of the comparator; and the comparator is connected to an energy supply that is independent of the piezo sensor.

4. The apparatus according to claim 1, wherein the piezo sensor, the rectifier, the peak-value detector, the high-pass filter and the comparator, are combined with the microprocessor into a component that forms a single mechanical unit that is secured to a housing of the percussion device.

5. The apparatus according to claim 1, wherein the piezo sensor, the rectifier, the peak-value detector, the high-pass filter and the comparator are designed and matched to one another such that the conversion apparatus is capable of functioning at impact frequencies of the percussion device between 3 and 70 Hz.

6. The apparatus according to claim 1, wherein the percussion device is a hydraulic hammer.

\* \* \* \* \*